(12) United States Patent
Hinterscher et al.

(10) Patent No.: US 7,064,593 B2
(45) Date of Patent: Jun. 20, 2006

(54) BUS-HOLD CIRCUIT

(75) Inventors: Gene B. Hinterscher, Mckinney, TX (US); Susan A. Curtis, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/012,448

(22) Filed: Dec. 14, 2004

(65) Prior Publication Data

US 2006/0061398 A1    Mar. 23, 2006

Related U.S. Application Data

(60) Provisional application No. 60/611,447, filed on Sep. 20, 2004.

(51) Int. Cl.
*H03K 3/02*    (2006.01)

(52) U.S. Cl. .................. 327/198; 327/199; 327/332

(58) Field of Classification Search ............. 327/198, 327/199, 331–333; 326/30, 86, 90
See application file for complete search history.

(56) References Cited

U.S. PATENT DOCUMENTS

| | | | |
|---|---|---|---|
| 5,739,702 A | 4/1998 | Shigehara et al. | 326/86 |
| 5,764,468 A * | 6/1998 | Aalmers et al. | 361/91.5 |
| 5,903,180 A * | 5/1999 | Hsia et al. | 327/333 |
| 5,973,530 A * | 10/1999 | Morris et al. | 327/210 |
| 6,097,229 A | 8/2000 | Hinterscher | 327/199 |
| 6,150,845 A | 11/2000 | Morrill | 326/81 |
| 6,172,519 B1 | 1/2001 | Chiang et al. | 326/38 |
| 6,184,715 B1 * | 2/2001 | Catanzaro et al. | 326/81 |
| 6,191,607 B1 | 2/2001 | Meng et al. | 326/37 |
| 6,222,387 B1 * | 4/2001 | Meng et al. | 326/83 |
| 6,265,931 B1 * | 7/2001 | Lutley et al. | 327/530 |
| 6,351,174 B1 | 2/2002 | Soltero et al. | 327/333 |
| 6,504,401 B1 | 1/2003 | Huang et al. | 326/181 |
| 6,724,224 B1 * | 4/2004 | Li | 326/82 |
| 6,731,137 B1 * | 5/2004 | Rangan et al. | 326/86 |
| 6,774,675 B1 | 8/2004 | Miske et al. | 326/81 |

* cited by examiner

*Primary Examiner*—Timothy P. Callahan
*Assistant Examiner*—Hai L Nguyen
(74) *Attorney, Agent, or Firm*—J. Dennis Moore; W. James Brady, III; Frederick J. Telecky, Jr.

(57) ABSTRACT

A bus hold circuit that satisfies both the over-voltage tolerance and maximum leakage current '$I_{off}$' specification without incorporating a diode in pull-up path of a bus-hold circuit is disclosed herein. Specifically, the bus-hold circuit includes a first subcircuit portion operable to provide the bus-hold feature of the circuit connected to a second sub-circuit portion. The second sub-circuit portion provides the over-voltage tolerance feature and minimizes the leakage current in the bus-hold circuit. The bus-hold circuit in accordance with the present invention is enhances the performance of the bus-hold current by eliminating the voltage drop across the diodes customarily included within known bus-hold circuit designs. Thereby, this implementation eliminates the negative diode effect on the minimum high sustaining bus-hold current (IBHH) at low supply voltages due to the voltage drop across the diode.

7 Claims, 4 Drawing Sheets

BUS-HOLD CIRCUIT

This application claims priority under 35 USC 119(e) of provisional application Ser. No. 60/611,447 filed Sep. 20, 2004.

FIELD OF THE INVENTION

The present invention relates to bus-hold interface circuits and, more particularly, a bus-hold circuits that satisfy both over-voltage tolerance and maximum leakage current '$I_{off}$' specifications.

BACKGROUND OF THE INVENTION

In the advent of technology becoming more efficient, smaller and having enhanced performance, many integrated circuits include an increased number of components operating at a faster speed and placed on a smaller region of the integrated circuit 'real-estate.' As a result, power consumption of the device increases. Yet, this increase in power consumption leads to an ultimate increase in the heat of each device within a system. This heat is expensive to dissipate. In addition, an increase in power consumption is not efficient when the power supply of an electronic device has a finite supply of power (i.e. a battery operated electronic device).

There are, however, two ways in which power consumption may be decreased. First, power consumption may be decreased by decreasing the operating voltage of the electronic device. These devices include multiple computing and peripheral devices. Circuit buses provide a backbone network interface between multiple computing and peripheral devices. As such, these buses transfer electrical signals from one device to another as a means of communication. Examples of some of the devices associated with bus interconnections include macro devices such as computers, printers, and communications devices. In addition, some of the devices represented on the bus may also include internal system components such as microprocessors, memory cells, etc. The output driver of each device includes bus-interface input and output circuits to communicate with other coupled devices on the bus. Each bus-interface circuit regulates out-going signal transmission and in-coming signal reception from such other devices connected to the bus. As a means for ensuring that only one device has access to the bus at a time, all other devices connected to the bus are required to place a high-impedance condition on the bus so that no unintended signal transfer may occur. Therein, three states exist for a bus-interface circuit: a first bus-drive condition designed to transfer the equivalent of a logic low signal, a second bus-drive condition designed to transfer the equivalent of a logic high signal, and a third bus-drive condition equivalent to a high-impedance or tri-stated state.

With reference to decreasing power consumption of the system, conventionally most integrated circuits operate at 5 volts. Presently operating voltages of 3.3, 2.5 and 1.8 are available for integrate circuits. As previously described, since each device is incorporated into one system that uses one bus, the bus interface must enable each and every device, regardless of operating voltage, connected to the bus to communicate with each other. As is shown in FIG. 1a, bus 15 may include several devices that operate at a variety of voltages. Specifically, output driver 12 has an operating voltage of 3.3V and output drivers, 14 and 16, have an operating voltage of 5.5V. Damage, however, may result to a device, if a device operating at a higher operating voltage takes hold of the bus 15 and places electrical signal on the bus 15. Output driver 12 having the lower operating voltage will overheat as a result of a signal placed on the bus 15 by either output driver, 14 and 16, having the higher operating voltage. Typically, output driver 12 will include a pull up device 18 as is shown in FIG. 1b. As a result of a higher operating voltage takes hold of the bus 15 and places electrical signal on the bus 15, over a process of time, pull-up device 18 will start to degrade due-to the over-voltage condition.

A second solution that decreases power consumption is to reduce the leakage current within each device. A substantial portion of the leakage current within a system is present as a result of each output driver from each component connected to the bus located within the system. Thereby, current specifications have been derived that limit the leakage current of an output driver to a maximum value when the supply voltage is set at zero. This maximum leakage current specification exists for current that flows into the input transistor when forcing the input to a higher supply voltage. In the alternative, this maximum leakage current specification exists for current that flows out of the output transistor when forcing the output to a higher supply voltage. This current must be compliant with what those skilled in the art have termed the '$I_{off}$' specifications.

To accommodate for the over voltage condition and leakage current problem, a bus-hold circuit is utilized. The bus-hold circuit is a specific type of bus-interface circuit included within an output driver. Specifically, bus-hold circuits keep the output node of the corresponding device at a known value when no driver is active on the bus. When a driver on the same or another integrated circuit device places a low value on the output node and thereafter is tri-stated, the bus-hold circuit will retain the low value at the output node. In the same fashion, if the device places a high value on the output node and thereafter is tri-stated, the bus-hold circuit will retain the high value. Traditionally, a bus-hold circuit is implemented as a latch, e.g., as a pair of cross-coupled inverters, with one of the two inverters being a weak inverter that drives the output node.

A known solution to the over-voltage condition is to incorporate a diode in pull-up path of a bus-hold circuit to help satisfy over-voltage tolerance and maximum leakage current specifications as is shown in FIG. 2. Over-voltage tolerance, in this case, is when the voltage applied at the input $In_4$ is forced to a level above the supply voltage $V_{CC}$. Over-voltage tolerance allows a higher supply voltage to be connected to an input with a lower supply voltage. For example, if a 5V CMOS driver is active on the bus, bus-hold circuit 20 must enable the output driver operating at 3.3V not to sink any current nor be damaged when the bus is driven to 5V. Diodes, $D_1$ and $D_2$, are standard bus-hold diodes located within the pull-up path. These diodes, $D_1$ and $D_2$, block the current that would damage the power supply $V_{CC}$. Accordingly, if the voltage applied to input $In_4$ is 5.5V and the power supply voltage $V_{CC}$ is 3.3V, diodes, $D_1$ and $D_2$, block current from damaging transistor 24.

When the power supply voltages are at low voltages, however, the effect of diodes, $D_1$ and $D_2$, are quite substantial. As shown in FIGS. 4 and 5, the input bus-hold current or the minimum high sustaining bus-hold current IBHH is shown as positive portion of the curve. The minimum high sustaining bus-hold current IBHH is the input current that holds the input to the previous state when the output driving device goes to a high-impedance state. Particularly, the minimum high sustaining bus-hold current IBHH is the minimum high sustaining bus-hold current. As supply voltages $V_{CC}$ become lower, the voltage drop across the diodes, $D_1$ and $D_2$, becomes greater and thereby, negative effects the minimum high sustaining bus-hold current (IBHH). As a result of the effect of diodes, $D_1$ and $D_2$, the minimum high sustaining bus-hold current IBHH is inhibited substantially which tends to make the IBHH curves to appear as part of a saw-tooth curve as opposed to a more sinusoidal one. Note, the input bus-hold current curves IBHH and the output bus-hold current curves IBHL should be a mirror image of one another. Yet, at this voltage, the diodes substantially alter the input bus-hold current curves IBHH.

Other bus-hold solutions satisfy the maximum leakage current '$I_{off}$' specification, yet fail to support over-voltage tolerance specifications.

Thus, there exists a need for a bus-hold circuit that satisfies both the over-voltage tolerance and maximum leakage current '$I_{off}$' specification without incorporating a diode in pull-up path of a bus-hold circuit.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of bus-hold circuits, the present invention teaches a bus hold circuit that satisfies both the over-voltage tolerance and maximum leakage current '$I_{off}$' specification without incorporating a diode in pull-up path of a bus-hold circuit. Specifically, the bus-hold circuit includes a first subcircuit portion operable to provide the bus-hold feature of the circuit coupled to a second subcircuit portion. The first sub-circuit portion includes an input connected to an inverter. The inverter connects to a first node. A resistor connects to the input and a second node. A first n-channel device connects between the second node and ground. A first p-channel device connects between a third node and the second node. The first p-channel device and the first n-channel device are biased by the first node. A second p-channel device connects between the third node and the power supply rail $V_{CC}$. This second p-channel device is biased by a fourth node. This second p-channel device provides control for the second subcircuit portion.

The second subcircuit portion provides the over-voltage tolerance feature and minimizes the leakage current in the bus-hold circuit. Specifically, the second subcircuit portion includes a second n-channel device connected between a fifth node and a sixth node. It is biased by the first node. A first and second diode connect to the fifth node. The opposing end of the first diode connects to a sixth node and the opposing end of the second diode connect to a seventh node. A third n-channel device connects between the sixth node and the second node. The third n-channel device is biased by the sixth node. A third p-channel device connects between the sixth node and the second node. It is biased by the power supply rail. A fourth n-channel device connects between ground that the fourth node. The fourth n-channel device is biased by the seventh node. A fourth p-channel device is coupled between the fourth and second node. This fourth p-channel device is biased by an eight node. A fifth p-channel device connects between the seventh node and the power supply rail. This device is biased by the second node. A sixth p-channel device is connected between the eight node and the power supply rail. The sixth p-channel device is biased by the eight node. A third and fourth diode connect to the power supply rail. The opposing end of the third diode connects to a eight node and the opposing end of the fourth diode connect to the seventh node.

The advantages of this bus-hold circuit is that this implementation teaches a bus hold circuit that satisfies both the over-voltage tolerance and maximum leakage current '$I_{off}$' specification without incorporating a diode in pull-up path of a bus-hold circuit.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1A:
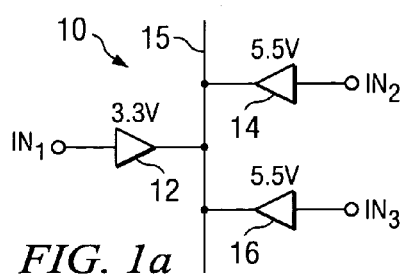
FIG. 1a is a known bus configuration including various output drivers as differing operating voltages.
Figure 1B:
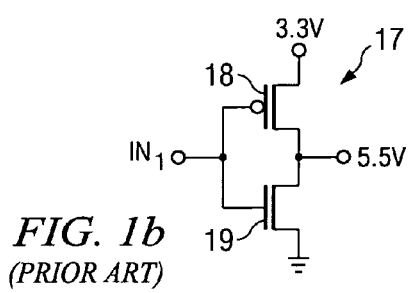
FIG. 1b is a known output driver.

One or more exemplary implementations of the present invention will now be described with reference to the attached drawings, wherein like reference numerals are used to refer to like elements throughout. The various aspects of the invention are illustrated below in a high voltage level shifter, although the invention and the appended claims are not limited to the illustrated examples.

Figure 3:
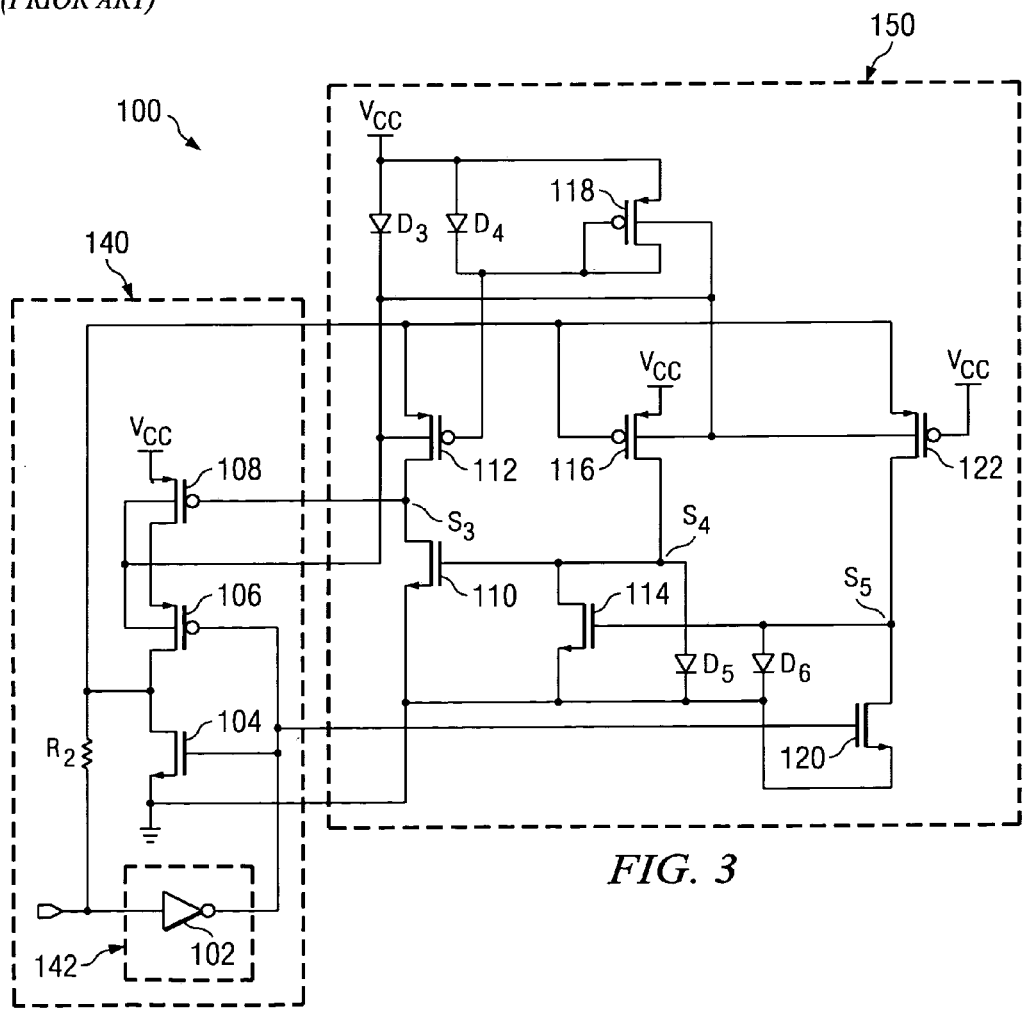
FIG. 3 displays a bus-hold circuit in accordance with the present invention.
Figure 4:
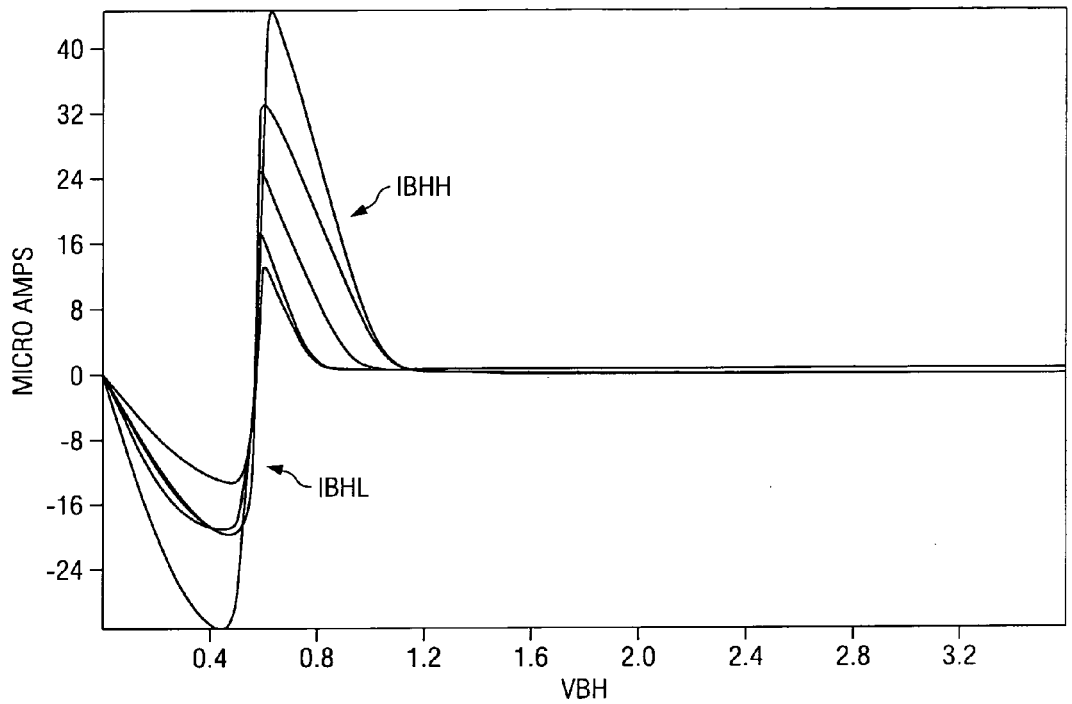
FIG. 4 shows a set of bus-hold current curves for the known bus-hold circuit of FIG. 2 wherein the supply voltage $V_{CC}$ is 1.1V.
Figure 5:
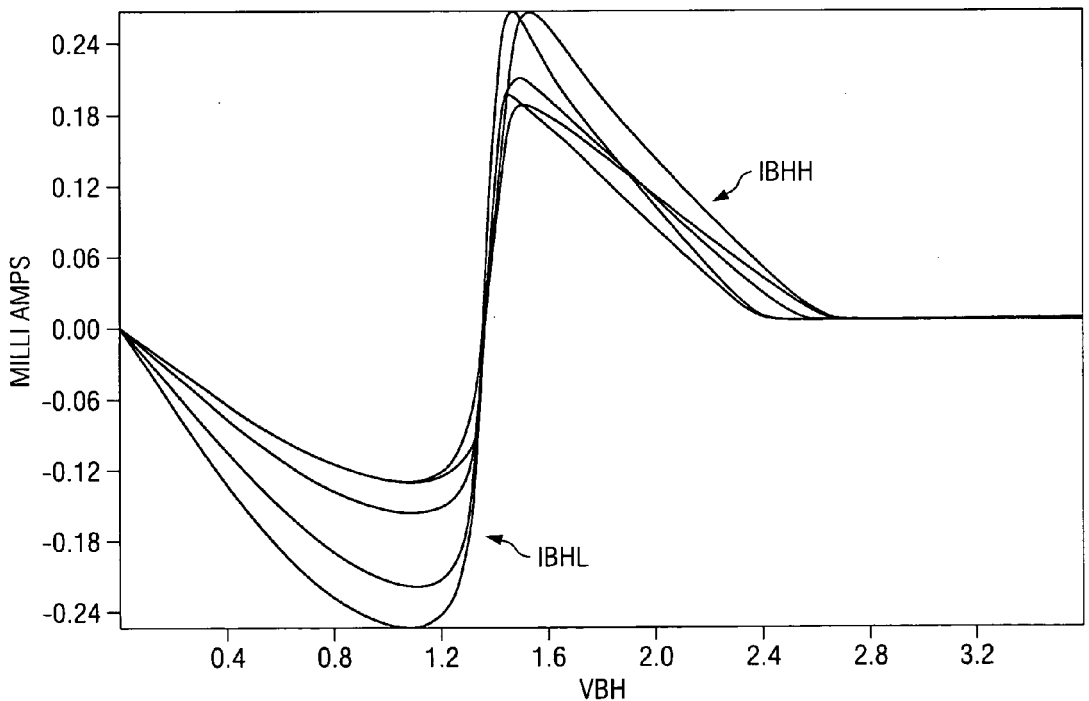
FIG. 5 shows a set of bus-hold current curves for the known bus-hold circuit of FIG. 2 wherein the supply voltage $V_{CC}$ is 2.7V.

FIG. 3 illustrates the bus-hold circuit in accordance with the present invention that satisfies both the over-voltage tolerance and maximum leakage current 'I$_{off}$' specification without incorporating a diode in pull-up path of a bus-hold circuit. Specifically, the bus-hold circuit includes a first subcircuit portion 140 operable to provide the bus-hold feature of the circuit coupled to a second subcircuit portion 150. The first sub-circuit portion includes a latch 142 connected to a current limiting resistor R$_2$. Latch 142 includes inverter 102, n-channel device 104, and p-channel device 106 coupled as shown. P-channel device 108 provides control to limit the maximum leakage current 'I$_{off}$' and control for over-voltage tolerance.

The second sub-circuit 150 provides the over-voltage tolerance feature and minimizes the leakage current in the bus-hold circuit 100. Diode D$_3$ is a current blocking diode for the back-gates diode parasitics of the p-channels. As shown, the backgate nodes of devices 108, 106, 112, 116, 118, and 122 all couple to one end of diode D$_3$. Devices 110, 112, 114, 116, 118, 120, 122 provide bias for device 108 at the gate of P-channel 108 during all three stages of operation described as follows. Diodes, D$_3$ and D$_4$, are not in the pull-up path of bus-hold circuit 100 which is how this implementation differs substantially from the known bus-hold circuit shown FIG. 2. Devices 114 and 122 are clamping devices that will be 'off' and will be used to satisfy over-voltage tolerance and Ioff specifications as will be described. Diodes, D$_5$ and D$_6$, are reverse leakage current diodes. Diode D$_4$ and device 118 help to sustain a voltage level slightly lower than the supply voltage V$_{CC}$ in an effort to make certain that p-channel device 112 reacts quickly to an over-voltage tolerance and maximum leakage current 'Ioff' condition. Devices 116 and 110 are used as a feedback latch to insure the input voltage level IN$_4$ latches to its previous state when the driving device goes to a high impedance state. Devices 116 and 110 are used as a feedback latch to insure the input voltage level IN$_4$ latches to its previous state when the driving device goes to a high impedance state. Device 114 turns device 110 'off' during the maximum leakage current condition to allow device 112 to control the gate of device 108.

Figure 2:
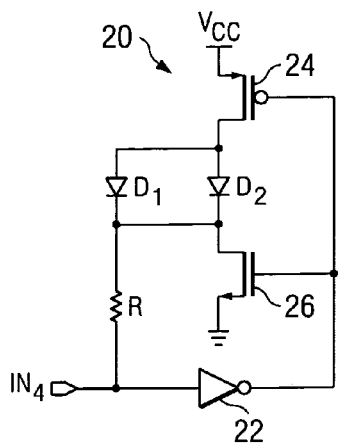
FIG. 2 illustrates a known bus-hold circuit.

Specifically, in operation, the bus-hold circuit in accordance with the present invention of FIG. 3 effects an output driver similarly to the known bus-hold circuit of FIG. 2 with the exception of the problems with having a diode in the pull-up path of the known bus-hold circuit. The first stage of operation or during normal operation, p-channel clamping devices 112 and 122 are "off" and are used to satisfy over-voltage tolerance and maximum leakage current 'I$_{off}$' specifications. The reverse leakage current of diode D$_6$ and n-channel device 122 force n-channel device 114 to an 'off' condition. P-channel device 116 insures that n-channel device 110 is 'on' if the input voltage level on the gate of device 116 goes slightly below the supply voltage. As a result, device 116 sends a 'high' to node s$_4$ which turns device 110 'on'. As a result, node s$_3$ transitions 'low' and turns p-channel device 108 'on'. Devices, 116 and 110, have been designed to emulate a feedback latch to insure that the input IN$_4$ voltage level latches to its previous state when the output driver that includes bus-hold circuit 100 goes to a high-impedance state. As a result, the signal at node s$_3$ remains 'low' until an Ioff or over-voltage tolerant condition exists. The reverse leakage current of diode D$_5$ will help stabilize signal s$_4$ when P-channel device 116 is in the 'off' condition. Diode D$_4$ and 118 will sustain a voltage level slightly lower than the supply voltage to make sure P-channel device 112 reacts quickly to a over-voltage tolerance and maximum leakage current 'I$_{off}$' condition. One of the underlying principals for the operation of subcircuit 150 is that it does not interfere during normal operation of bus-hold circuit 150. Thereby, subcircuit 150 is primarily used during over-voltage tolerance and maximum leakage current 'I$_{off}$' condition.

In the second stage, the maximum leakage current 'I$_{off}$' into and out of the input and output transistors when forcing the input IN$_4$ to a given DC voltage when the supply voltage V$_{CC}$ is zero volts. During the maximum leakage current 'I$_{off}$' test, input signal IN$_4$ is ramped to a given positive voltage. Since the voltage applied to the gate of device 122 is zero volts because V$_{CC}$=0, the signal at node s$_5$ tracks the DC voltage of the input IN$_4$. Accordingly, device 114 is forced to an 'on' condition and device 110 is forced to an 'off' condition. Thereby, device 114 is given control of the gate of device 108 when the source of device 114 is pulled to one threshold voltage V$_t$ above the voltage supply level V$_{CC}$. The signal at node s$_3$ 'tracks' the DC voltage on the input IN$_4$ through device 112 and forces device 108 to an 'off' condition. As a result, any unwanted leakage current will be eliminated. During this stage, however, device 116 has no effect in an maximum leakage current 'I$_{off}$' condition since the drain and source of device 116 are fixed at zero volts.

In a third stage, an over-voltage tolerance condition exists where the voltage on input node IN$_4$ is forced a level above the supply voltage V$_{CC}$. When input IN$_4$ is forced above the supply voltage V$_{CC}$, device 120 'off'. Accordingly, device 122 controls the gate of device 114 as soon as the source of device 122 is pulled one threshold voltage V$_t$ above the input voltage level IN$_4$. As a result, device 114 is turned 'on' and device 110 is turned 'off'. Accordingly, device 112 is given control of the gate of device 108, when the source of device 112 is pulled one threshold voltage V$_t$ above the input voltage level IN$_4$. The gate of device 108 'tracks' the over-voltage tolerance condition at the input IN$_4$ through device 112. As a result, device 108 is forced it to an "off" condition and, thereby, will eliminate any unwanted over-voltage leakage current. During this stage of operation, however, device 116 will be 'off' because the gate of device 116 will be at a higher voltage level than the source of device 116.

Figure 6:
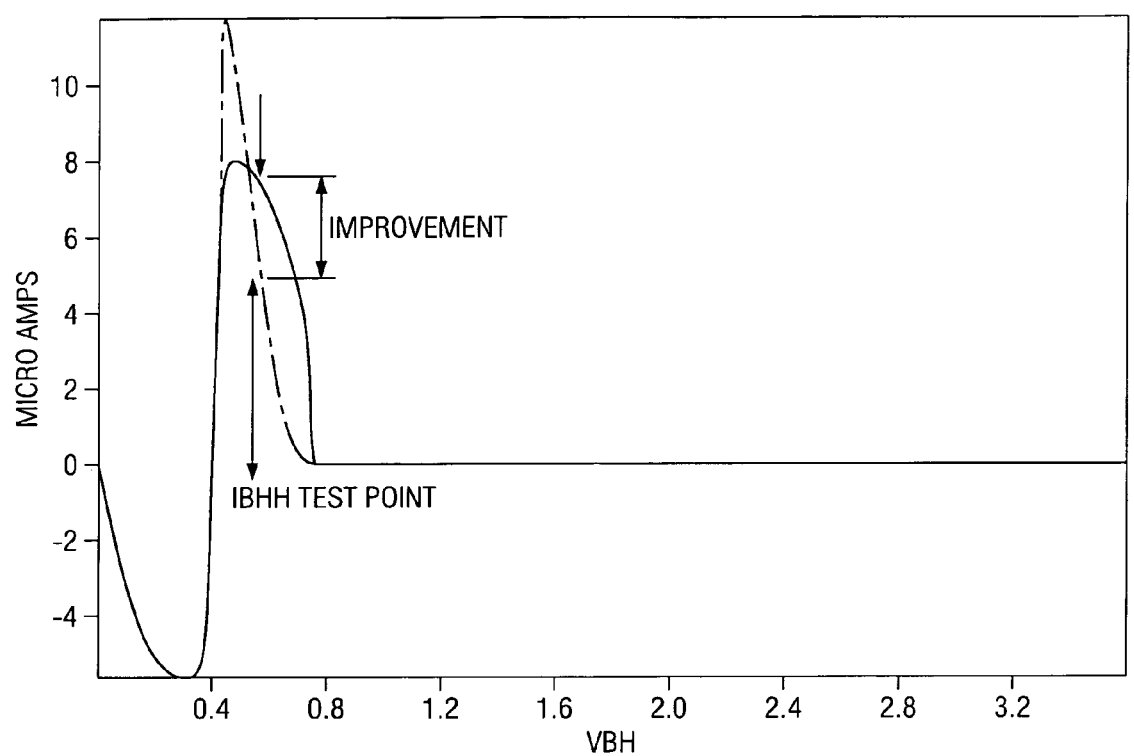
FIG. 6 shows a comparison of a bus-hold current curve for the known bus-hold circuit of FIG. 2 (dashed lines) and the bus-hold circuit of FIG. 3 in accordance with the present invention wherein both operate using a supply voltage $V_{CC}$ is 0.8V.
Figure 7:
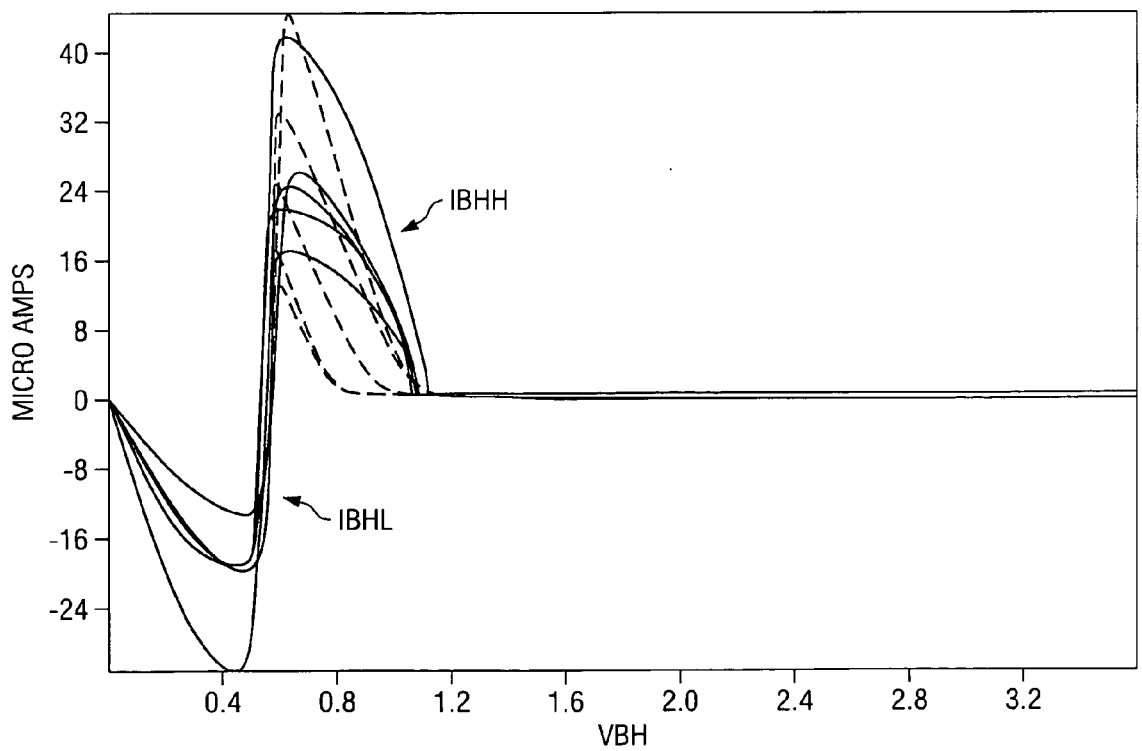
FIG. 7 shows a comparison of bus-hold current curves for the known bus-hold circuit of FIG. 2 (dashed lines) and the bus-hold circuit of FIG. 3 in accordance with the present invention wherein both operate using a supply voltage $V_{CC}$ is 1.1V.
Figure 8:
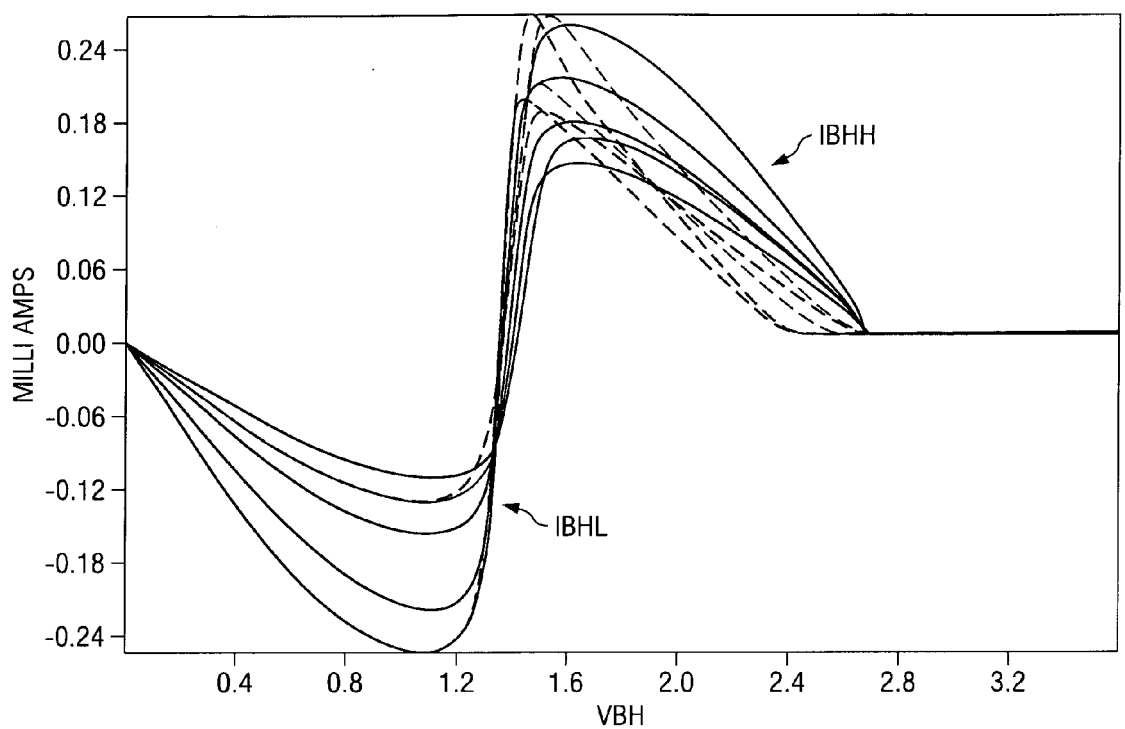
FIG. 8 shows a comparison of bus-hold current curves for the known bus-hold circuit of FIG. 2 (dashed lines) and the bus-hold circuit of FIG. 3 in accordance with the present invention wherein both operate using a supply voltage $V_{CC}$ is 2.7V.
Figure 9:
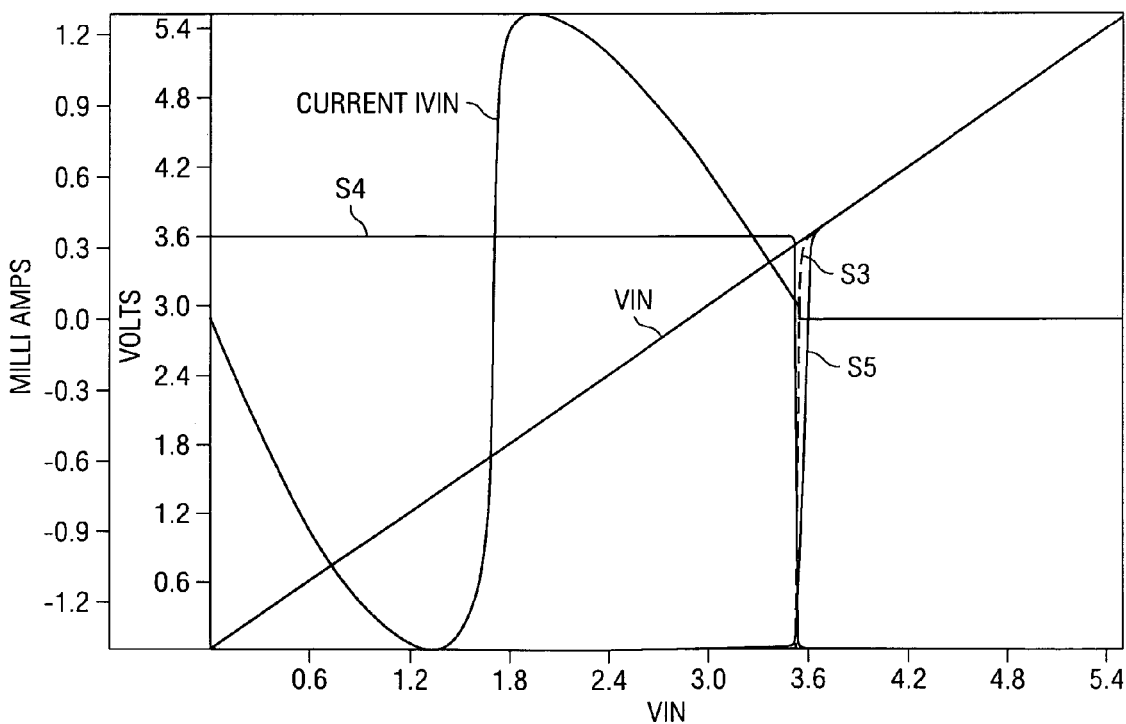
FIG. 9 displays a bus-hold current curve and voltages of nodes $s_3$, $s_4$ and $s_5$ of the bus-hold circuit of FIG. 3 in accordance with the present invention.

FIGS. 6, 7, and 8 compares the bus-hold current performances between the bus-hold circuit in accordance with the present invention shown in FIG. 3 and the known bus-hold circuit having a diode in the pull-up path as is shown in FIG. 2. The solid curves are from the circuit in FIG. 3 and the dashed curves are from FIG. 2. FIG. 6 demonstrates the IBHH improvement at a supply voltage of 0.8V. FIG. 7 illustrates the bus-hold curves, over process and temperature, with a supply voltage of 1.1V. FIG. 8 illustrates the advantage of FIG. 3 at a higher supply voltage Vcc=2.7V. FIG. 9 displays the current curve and voltages at nodes s$_3$, s$_4$, and s$_5$ for the novel bus-hold circuit of FIG. 3.

Specifically, the bus-hold current curves illustrated in FIG. 6 represent the performance of both bus-hold circuits, 20 and 100, where the supply voltage V$_{CC}$ of each are both at 0.8V. The current curve of bus-hold circuit 20 is represented by dashed line, wherein the current curve of bus-hold circuit 100 is represented by a solid line. As is shown, the known bus-hold circuit 20 has a problem where a spike of current exists. This spike is indicative of the substantial amount of current that may pass through and damage the controlling device 24.

FIG. 7 shows the performance of the bus-hold circuit 100 in accordance with the present invention as compared to that of the known bus-hold circuit 20 at voltage supply $V_{CC}$ at 1.1 volts. The current curves of FIG. 2 standard bus-hold are represented by the dashed lines. The current curves of FIG. 3 are represented by the solid lines. The desired response is to have the high curves IBHH to be identical in value to the lower curves. Notice that for the current curves of the known bus-hold circuit, the high curves IBHH are not identical in value to the lower curves IBHL.

FIG. 8 represents the performance of the bus-hold circuit 100 in accordance with the present invention as compared to that of the known bus-hold circuit 20 at voltage supply VCC at 2.7 volts. As is shown, the same response happens as in the previous example shown in FIG. 7. The current curves of the known bus-hold circuit 20 includes high curves IBHH that are not identical in value to lower curves IBHL.

Advantages of the bus-hold circuit in accordance with the present invention include, but are not limited to, a bus-hold circuit that satisfies both the over-voltage tolerance and maximum leakage current '$I_{off}$' specification without incorporating a diode in pull-up path of a bus-hold circuit. The bus-hold circuit in accordance with the present invention is enhances the performance of the bus-hold current IBHH by eliminating the voltage drop across the diode. Thereby, this implementation eliminates the negative diode effect on the minimum high sustaining bus-hold current (IBHH) at low supply voltages due to the voltage drop across the diode.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims that follow.

Those of skill in the art will recognize that the physical location of the elements illustrated in FIG. 3 can be moved or relocated while retaining the function described above.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A bus-hold circuit, comprising:
   a first subcircuit portion operable to provide the bus-hold feature of the circuit, wherein the first subcircuit portion, having an input, includes,
      an inverter coupled between a first node and the input,
      a resistor coupled between a second node and the input,
      a first n-channel device coupled between the second node and ground, the first n-channel device biased by the first node,
      a first p-channel device coupled between the second node and a third node, the first p-channel device biased by the first node, and
      a second p-channel device coupled between the third node and a power supply rail, the second p-channel device biased by the fourth node;
   a second subcircuit portion coupled to the first subcircuit portion for generating over-voltage tolerance and limiting leakage current of the bus-hold circuit, wherein the second subcircuit portion includes,
      a second n-channel device coupled between a fifth node and a sixth node, the second n-channel device biased by the first node,
      a first diode coupled between the fifth node and the sixth node,
      a second diode coupled between the fifth node and a seventh node,
      a third n-channel device coupled between the fifth node and the seventh node, the third n-channel device biased by the sixth node,
      a third p-channel device coupled between the sixth node and the second node, the third p-channel device biased by the power supply rail,
      a fourth n-channel device coupled between ground and the fourth node, the fourth n-channel device biased by the seventh node,
      a fourth p-channel device coupled between the fourth node and the second node, the fourth p-channel device biased by an eight node,
      a fifth p-channel device coupled between the seventh node and the power supply rail, the fifth p-channel device biased by an second node,
      a sixth p-channel device coupled between the eight node and the power supply rail, the sixth p-channel device biased by the eight node,
      a third diode coupled between the power supply rail and the eight node, and
      a fourth diode coupled between the power supply rail and the second node.

2. The bus-hold circuit as recited in claim 1, wherein the first n-channel device, the second n-channel device, the third n-channel device, the fourth n-channel device are N-type transistors.

3. The bus-hold circuit as recited in claim 1, wherein the first p-channel device, the second p-channel device, the third p-channel device, the fourth p-channel device, the fifth p-channel device, and the sixth p-channel device are P-type transistors.

4. The bus-hold circuit as recited in claim 2, wherein the first N-type transistor, the second N-type transistor, the third N-type transistor, and the fourth N-type transistor are metal oxide semiconductor field-effect transistors.

5. The bus-hold circuit as recited in claim 3, wherein the first P-type transistor, the second P-type transistor, the third P-type transistor, the fourth P-type transistor, the fifth P-type transistor and the sixth P-type transistor are metal oxide semiconductor field-effect transistors.

6. The bus-hold circuit as recited in claim 3, wherein the first P-type transistor, the second P-type transistor, the third P-type transistor, the fourth P-type transistor, the fifth P-type transistor and the sixth P-type transistor each include a backgate node coupled to each other.

7. The bus-hold circuit as recited in claim 1, wherein the first diode, the second diode, the third diode and the fourth diode are Zener diodes.

* * * * *